(12) United States Patent
Origasa et al.

(10) Patent No.: US 7,072,241 B2
(45) Date of Patent: Jul. 4, 2006

(54) SEMICONDUCTOR MEMORY DEVICE AND MULTI-CHIP MODULE COMPRISING THE SEMICONDUCTOR MEMORY DEVICE

(75) Inventors: Kenichi Origasa, Osaka (JP); Yuji Yamasaki, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/131,385

(22) Filed: May 18, 2005

(65) Prior Publication Data

US 2005/0205983 A1   Sep. 22, 2005

Related U.S. Application Data

(62) Division of application No. 10/352,070, filed on Jan. 28, 2003, now abandoned.

(30) Foreign Application Priority Data

Feb. 19, 2002  (JP) ............................. 2002-041108

(51) Int. Cl.
  *G11C 8/00* (2006.01)
  *G11C 5/06* (2006.01)
  *G11C 11/50* (2006.01)
(52) U.S. Cl. ................. 365/230.03; 365/63; 365/164
(58) Field of Classification Search ........... 365/230.03, 365/164, 63
  See application file for complete search history.

(56) References Cited

U.S. PATENT DOCUMENTS

| | | | |
|---|---|---|---|
| 5,898,223 A * | 4/1999 | Frye et al. .................. 257/777 |
| 5,943,254 A | 8/1999 | Bakeman et al. | |
| 5,983,331 A | 11/1999 | Akamatsu et al. | |
| 6,252,305 B1 * | 6/2001 | Lin et al. .................... 257/777 |
| 6,337,579 B1 | 1/2002 | Mochida | |
| 6,392,304 B1 | 5/2002 | Butler | |
| 6,424,034 B1 | 7/2002 | Ahn et al. | |
| 6,556,409 B1 * | 4/2003 | Chittipeddi et al. ........ 361/111 |
| 6,731,011 B1 * | 5/2004 | Verma et al. ............... 257/777 |
| 2001/0000013 A1 | 3/2001 | Lin | |
| 2001/0050573 A1 | 12/2001 | Dumbri | |
| 2002/0060933 A1 * | 5/2002 | Matsuzaki et al. .......... 365/200 |
| 2003/0040140 A1 | 2/2003 | Nakai | |
| 2003/0085461 A1 | 5/2003 | Sakiyama et al. | |

(Continued)

FOREIGN PATENT DOCUMENTS

JP           11-110963           4/1999

(Continued)

*Primary Examiner*—Amir Zararian
*Assistant Examiner*—Ly Duy Pham
(74) *Attorney, Agent, or Firm*—McDermott Will & Emery LLP

(57) ABSTRACT

In a semiconductor memory device composed of a semiconductor chip and overlaid to a surface of another semiconductor chip so as to connect together, a control circuit provided in the semiconductor memory device is provided with a chip connector portion having a plurality of pads. The chip connector portion is formed to have a configuration corresponding to the maximum capacity of the memory cell array provided in the semiconductor memory device, and the location and the number of the pads are invariably determined even when the memory cell array has a capacity less than the maximum capacity. The control circuit incorporating the chip connector portion is also invariably determined so as to control reading and writing data from and into the memory cell array having the maximum capacity, regardless of the capacity of the memory cell array provided.

8 Claims, 11 Drawing Sheets

U.S. PATENT DOCUMENTS

| | | |
|---|---|---|
| 2003/0140698 A1 | 7/2003 | Garverick et al. |
| 2003/0172364 A1 | 9/2003 | Lin |
| 2003/0201545 A1 | 10/2003 | Lin et al. |
| 2003/0209809 A1 | 11/2003 | Lasky et al. |
| 2004/0014308 A1 | 1/2004 | Kellar et al. |
| 2004/0026790 A1 | 2/2004 | Hikita et al. |

FOREIGN PATENT DOCUMENTS

| | | |
|---|---|---|
| JP | 2000-012764 | 1/2000 |
| JP | 2000-223657 | 8/2000 |
| JP | 2000-223661 | 8/2000 |
| JP | 2001-015680 | 1/2001 |
| JP | 2001-257266 | 9/2001 |

* cited by examiner

SEMICONDUCTOR MEMORY DEVICE AND MULTI-CHIP MODULE COMPRISING THE SEMICONDUCTOR MEMORY DEVICE

RELATED APPLICATION

This application is a Divisional of U.S. patent application Ser. No. 10/352,070, filed Jan. 28, 2003, now abandoned, which claims priority of Japanese application 2002-041108, filed Feb. 19, 2002, and the contents of which are hereby incorporated by reference.

BACKGROUND OF THE INVENTION

The present invention relates to semiconductor memory devices used for semiconductor devices commonly referred to as chip-on-chip configuration semiconductor devices.

In the past, a semiconductor device in which a semiconductor chip is overlaid onto the surface of another semiconductor chip to be connected together has been proposed. When overlaying together, a pair of chip connector portions of the semiconductor chips that are overlaid to each other need to be aligned in advance between the semiconductor chips. When one of the semiconductor chips to be overlaid is a semiconductor memory device such as a DRAM, the chip connector portion of the semiconductor memory device is constructed according to the memory capacity, the bus width for data input and output, and the like, and therefore, the chip connector portion of the other semiconductor chip (master chip) to be overlaid is formed according to the configuration of the chip connector portion of the semiconductor memory device.

In a semiconductor memory device, when the data bus width or the voltage generated by a voltage generator provided inside is to be set, one of the mask options that have been provided in advance is selected or one of a plurality of fuses is cut off to fixedly set the data bus width or the generated voltage at a desired value.

Generally, a refresh operation for the data stored in a memory cell array of a semiconductor memory device is performed in such a manner that a sequential selection of memory cells is repeated so that all the memory cells are refreshed. Also, when data are written in memory cells in the memory cell array, a configuration generally employed is such that only one word line that intersects with a bit line is activated.

The foregoing conventional configurations, however, have at least the following drawbacks. When the specifications of the semiconductor memory device, such as memory capacities and bus widths for data input and output, are to be changed, that is, when the semiconductor memory device to be overlaid is of compilable type, design change is necessary for the chip connector portion of the semiconductor memory device and the chip connector portion of the master chip to be connected every time the specification is changed, in order to correspond to the change in the specifications, necessitating extra man-hours.

In addition, when selection of mask options or cutting off of a fuse is adopted in order to set data bus widths and generated voltages of the internal voltage generator of the semiconductor memory device to be incorporated, it is necessary to arrange those mask options and a plurality of fuses, increasing manufacturing steps and accordingly the cost.

Moreover, if a semiconductor memory device has memory cells having a region that does not require a data holding operation during a refresh operation of the memory cells, the conventional configuration in which all the memory cells are refreshed is inefficient in terms of power consumption. Furthermore, the conventional configuration in which only one word line that intersects with a bit line is activated when data are written in a memory cell has a drawback that, for example, when performing a burn-in test, a long time is required to write data into all the memory cells and the efficiency of the test is poor.

SUMMARY OF THE INVENTION

Accordingly, it is an object to the present invention to provide a configuration of a desirable chip connector portion for a semiconductor memory device that is composed of one semiconductor chip that is to be overlaid on the surface of another semiconductor chip when used.

In order to accomplish the foregoing and other objects, the present invention provides a semiconductor memory device in which chip connector portions are standardized by using a single-configuration chip connector portion even if the capacities or data bus widths vary among the memory cell arrays.

Accordingly, the present invention provides a semiconductor memory device formed of a semiconductor chip and overlaid onto a surface of another semiconductor chip to be electrically connected therewith, comprising: a memory cell array having a plurality of memory cells; and a control circuit for controlling reading and writing from and into the memory cells in the memory cell array; wherein the memory cell array has a predetermined capacity that is selected from a plurality of capacities that are variably set; and wherein the control circuit is provided with a chip connector portion having terminals for connection with the other semiconductor chip, and the chip connector portion has an invariable configuration regardless of the size of the capacity of the memory cell array.

The present invention also provides a semiconductor memory device formed of a semiconductor chip and overlaid onto a surface of another semiconductor chip to be electrically connected therewith, comprising: a memory cell array having a plurality of memory cells; and a control circuit for controlling reading and writing from and into the memory cells in the memory cell array; wherein the memory cell array has a predetermined capacity that is selected from a plurality of capacities that are variably set; and wherein the control circuit is provided with a chip connector portion having terminals for connection with the other semiconductor chip, and each of the control circuit and the chip connector portion have an invariable configuration regardless of the size of the capacity of the memory cell array.

Preferably, the chip connector portion includes an operation specification-regulating terminal for regulating an operating specification of the semiconductor memory device.

Preferably, the chip connector portion includes a generated voltage-regulating terminal for regulating a generated voltage of a voltage generator.

The present invention also provides a semiconductor memory device formed of a semiconductor chip and overlaid onto a surface of another semiconductor chip to be electrically connected therewith, comprising: a memory cell array having a plurality of memory cells; and a control circuit for controlling reading and writing from and into the memory cells in the memory cell array; wherein the memory cell array comprises a chip connector portion having terminals for overlaying with the other semiconductor ship, and each memory cell array is formed into a module having a predetermined basic capacity; and wherein the chip connector portion is individually provided for each of the basic capacity units, and all the individually-provided chip connector portions have the same configuration.

Preferably, each of the individually provided chip connector portions includes an activation controlling terminal that controls, when a refresh operation in which a data rewriting operation is performed for memory cells in a basic capacity, whether the memory cells in the basic capacity is activated or is not activated.

Preferably, the refresh operation is an auto-refresh operation controlled by an external clock and a control terminal.

Preferably, the refresh operation is a self-refresh operation controlled by an internal clock generated internally.

Preferably, the memory cell array comprises a plurality of memory cell and a plurality of word lines connected to the plurality of memory cells; and each of the individually-provided chip connector portions comprises an all-of the-word-lines-activating terminal for activating all the plurality of word lines in a corresponding basic capacity when in a first electrical state.

Preferably, the memory cell array comprises a plurality of memory cell and a plurality of word lines connected to the plurality of memory cells; and each of the individually-provided chip connector portions comprises a half-of-the-word-lines-activating terminal for selectively activating about half of the plurality of word lines in a corresponding basic capacity according to an address signal when in a first electrical state.

Preferably, a ground wire is disposed in the same wiring layer in which the terminals of the chip connector portion is formed, the ground wire covering most of the memory cells in the corresponding basic capacity.

In another aspect, the present invention provides a multi-chip module comprising: a slave chip that is the semiconductor memory device according to claim 1; and a master chip having a chip connector portion in which terminals to be connected to the slave chip are formed; wherein the terminals of the chip connector portion of the slave chip are overlaid onto the terminals of the chip connector portion of the master chip to electrically connect the terminals of the respective chips together.

According to the present invention described above, the configurations of the chip connector portions and the control circuit incorporating the chip connector portions are the same regardless of the capacity of the memory cell array, and therefore, design change of the chip connector portions and the control circuit is unnecessary even when the specifications of the semiconductor chip such as data bus widths are changed. Thus, additional man-hours are not created.

In particular, according to the present invention, the operating specifications of the semiconductor chip and the generated voltage of the internal voltage generator can be individually adjusted and set through the operating specification-regulating terminal and the generated voltage-regulating terminal that are provided in the chip connector portion. Therefore, it is unnecessary to newly design the semiconductor chip exclusively for these purposes, and in addition, the need for the manufacturing process for fuse trimming is also eliminated.

Moreover, according to the present invention, the basic capacity portion is formed into a module including the chip connector portion. Therefore, even when the specification of capacity is changed to increase the capacity of the memory cell array, it is sufficient that one basic unit module is electrically connected or a plurality of the basic unit modules are electrically connected and it is unnecessary to newly design the chip connector portion.

Furthermore, according to the present invention, each chip connector portion of the basic capacity unit of the memory cell array can control whether a refresh operation is to be performed or not through the activation control terminal. Therefore, it is possible to inhibit a refresh operation in the basic capacity that does not require data retention, and to reduce power consumption accordingly.

In addition, according to the present invention, all the word lines in the basic capacity can be activated for each basic capacity through all-the-word-lines-activating terminal in the chip connector portion. Therefore, with one access to a bit line, data "0" can be written into half of the memory cells that are connected to the bit line while data "1" into the rest of the half at one time. Consequently, test time for the memory cell array and burn-in testing time can be remarkably reduced.

Further, according to the present invention, in each basic capacity, half of the word lines in the basic capacity can be activated according to an address signal through the half-of-the-word-lines-activating terminal in the chip connector portion. Therefore, with one access to a bit line, half of the memory cells connected to the bit line can be accessed. Consequently, the same data can be written into those memory cells, and topology match testing can be efficiently carried out, and burn-in testing time can be reduced.

In addition, according to the present invention, the ground lines cover substantially half of the entire memory cells in each basic capacity of the memory cell array, and therefore, it is possible to effectively suppress the noise generated by another semiconductor chip.

DETAILED DESCRIPTION OF THE INVENTION

Hereinbelow, preferred embodiments of the present invention are detailed with reference to the appended drawings.

Figure 1:
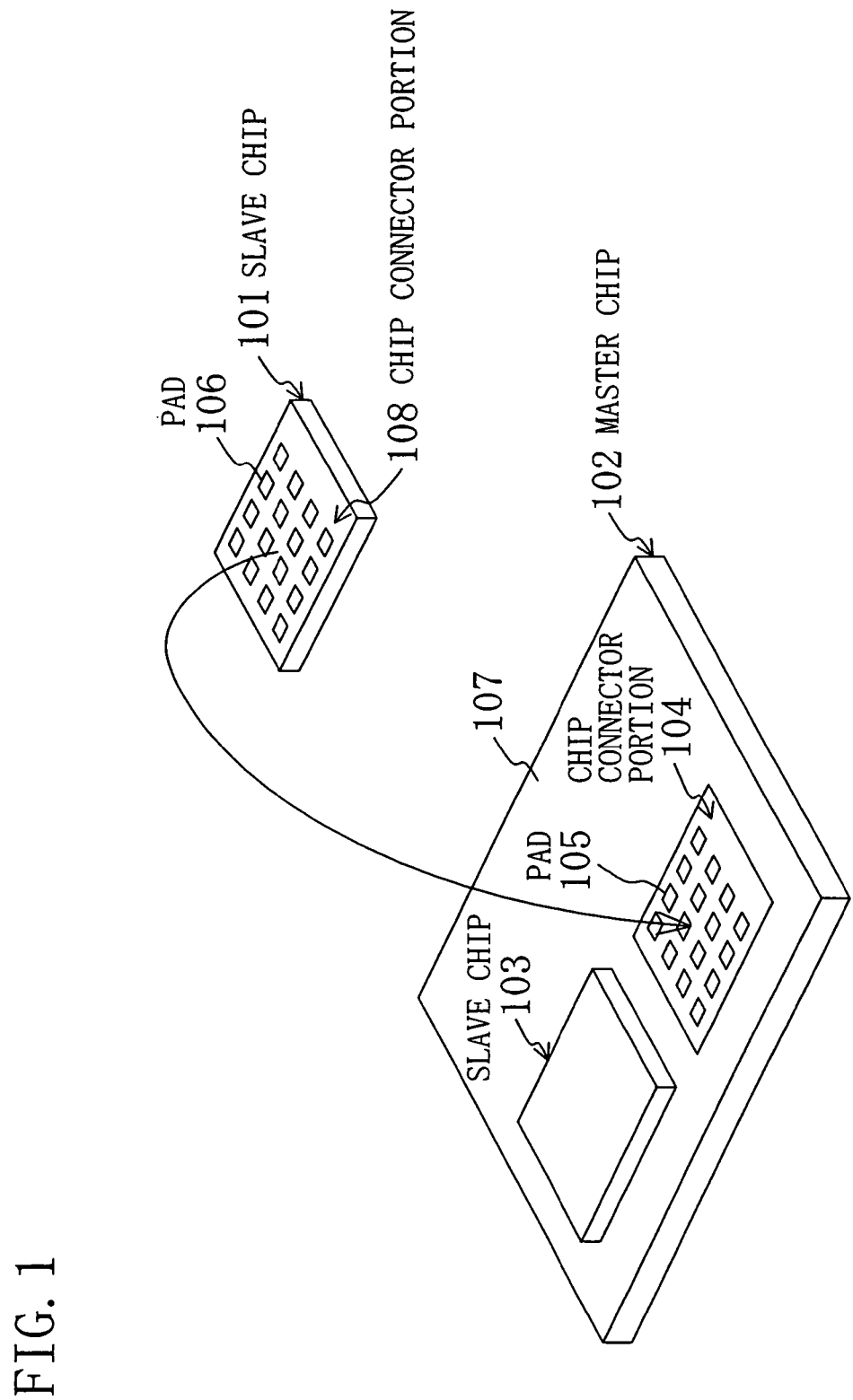
FIG. 1 is a perspective view showing a multi-chip module according to one embodiment of the present invention, a portion of which is disassembled.

FIG. 1 shows the configuration of a multi-chip module according to one embodiment of the present invention. The figure is a perspective view showing a multi-chip module known as a chip-on-chip type, a portion of which is dissembled for illustration.

FIG. 1 shows a slave chip (semiconductor chip) 101 that is a semiconductor memory device according to the present invention, a master chip 102 that is another semiconductor chip, and another slave chip 103. In the figure, reference numeral 104 denotes a chip connector portion for overlaying and connecting the slave chip 101 onto the master chip 102, numeral 105 denotes a interchip connection pad (terminal) for connection with the slave chip 101, which is formed in the chip connector portion 104 of the master chip 102, and numeral 106 denotes a interchip connection pad of the slave chip 101 that is used for connection with the master chip 102. Also shown in the figure are a surface 107 of the master chip 102 to which a functional element is disposed, and a surface 108 of the slave chip 101 to which a functional element is disposed. The slave chip 101 is overlaid on the master chip 102 for connection therewith. Likewise, the other slave chip 103 is connected onto the master chip 102.

The master chip 102 comprises, for example, a silicon semiconductor chip, and on the surface 107 thereof, functional elements such as transistors are formed on a semiconductor substrate. The outermost surface thereof is covered with a protective film of an insulating material. A plurality of interchip connection pads 105 for connection with the slave chip 101 are disposed in each of the chip connector portions 104 on the master chip 102 that connect the master chip 102 with the slave chips 101 and 103.

The slave chip 101 is also composed of, for example, a silicon semiconductor chip, and on the surface 108 thereof, functional elements such as transistors are formed on a semiconductor substrate. The outermost surface thereof is covered by a protective film of an insulating material. On the protective film, a plurality of interchip connection pads 106 102 are disposed for connection with the master chip, and these pads 106 are located at positions that correspond to the interchip connection pads 105 on the master chip 102.

On each of the interchip connection pads 105 and 106, bump electrodes of solder or the like are formed. Connections between the parent and slave chips are achieved by press-fitting the master chip 102 and the slave chip 101 with the connecting pads 105 and 106 interposed therebetween, and applying pressure and heat thereto.

The master chip 102 is provided with, for example, a gate array and a logic circuit formed therein. The slave chip 101 is a memory element such as DRAM, SRAM, a flash memory, a ferroelectric memory, EEPROM, a masked ROM, or the like, and the slave chip 103 is, for example, a CPU or an A/D converter element.

Figure 2:
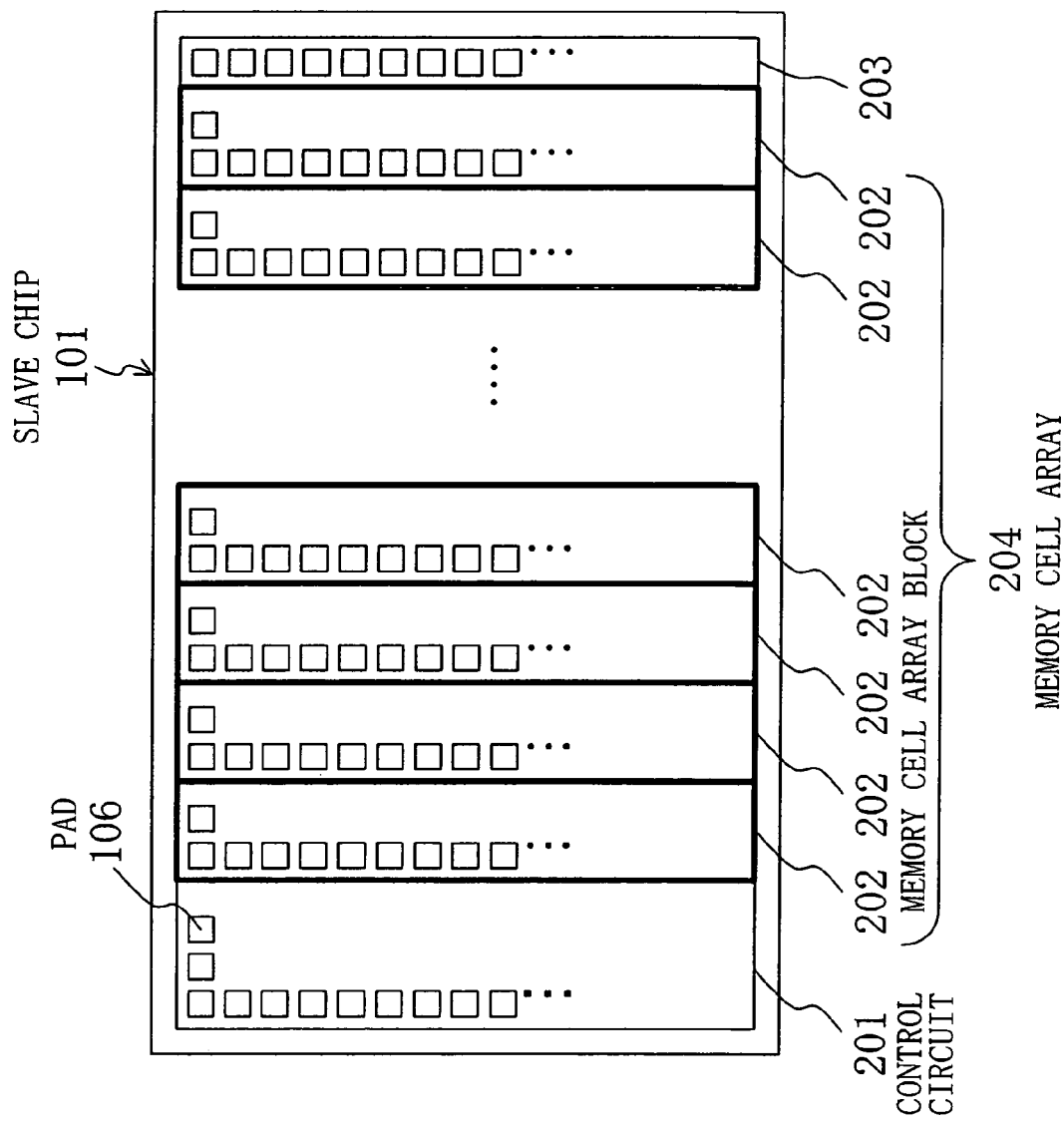
FIG. 2 is a plan view of a slave chip incorporated in the multi-chip module, showing the top surface thereof.

FIG. 2 is a plan view showing the surface 108 of the slave chip 101. In the figure, reference numeral 202 denotes a memory cell array block having a basic capacity, and a predetermined number of the memory cell array blocks 202 are connected to form a memory cell array 204 having a predetermined capacity. The slave chip 101 is of compilable type, in which the memory capacity can be changed by connecting a plurality of the memory cell array blocks 202 as in the manner shown in the figure. For example, if a single memory cell array block 202 has a basic capacity of 2 Mbits, a slave chip 101 having a capacity of 16 Mbits can be obtained by connecting 8 memory cell array blocks 202 together. In other words, the memory cell array 204 is constituted to have a desired, predetermined capacity appropriately selected from a plurality of capacities that are variably set, by connecting one or more memory cell array blocks 202, each of which is formed into a module having a basic capacity as a unit.

FIG. 2 also shows a control circuit 201 that controls reading and writing data from and into the memory cells in each of the memory cell array blocks 202. Reference numeral 203 denotes a peripheral circuit. Each of the control circuit 201, the memory cell array blocks 202, and the peripheral circuit 203 is provided with a plurality of interchip connection pads 106 for connection with the master chip 102. The peripheral circuit 203 is, for example, a boost-power supply for supplying voltage for word lines or a back bias-generating power supply for supplying a low voltage to the wells of the memory cells.

Figure 3:
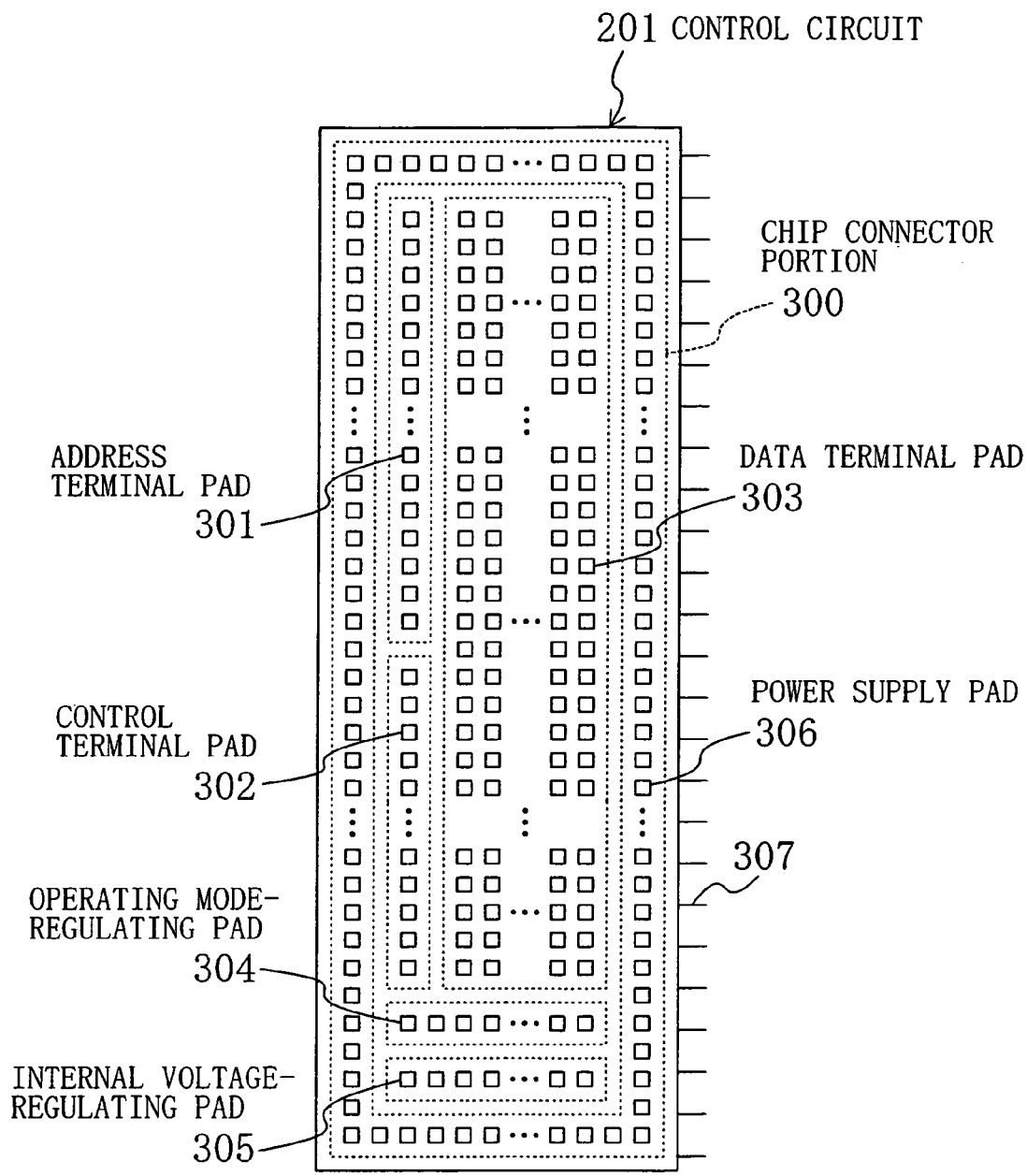
FIG. 3 is a diagram showing an example of arrangement of a plurality of pads provided in the chip connector portion of a control circuit that is incorporated in the slave chip.

FIG. 3 is a diagram showing the arrangement of the interchip connection pads 106 on the control circuit 201. As seen in the figure, a chip connector portion 300 having a multiplicity of pads (terminals) 301 to 306 is formed in an upper portion of the control circuit 201. In the chip connector portion 300, the pads 301 are for address terminals, the pads 302 are for control terminals, and the pads 303 are for data terminals. The pads 304 are operating mode-regulating pads for regulating the operating mode of the slave chip 101, the pads 305 are internal voltage-regulating pads for regulating the voltage of a power supply used inside the slave chip 101, and the pads 306 are power supply pads for supplying power from the master chip 102 to the slave chip 101. Reference numeral 307 denotes terminal for connecting the control circuit 201 with the memory cell array block 202 disposed at a side thereof In the chip connector portion 300, the locations and the numbers of all the pads 301 to 306 provided therein are invariably specified in advance regardless of the size of the capacity of the memory cell array 204, so that the chip connector portion 300 is formed to have the same configuration irrespective of the number of the memory cell array blocks 202 to be connected. Specifically, assuming that the maximum capacity that the slave chip 101 can incorporate is 16 Mbits and accordingly it requires 12 address terminals, for example, even if the slave chip in fact has a capacity of 2 Mbits and requires only 9 address terminals, the control circuit 201 disposed in the slave chip is provided with 12 address terminal pads 301 that are provided for the case of the maximum capacity. Also, when the slave chip 101 has a data terminal with the maximum bus width of 256 bit width, the data terminal pads 303 for 256 bit width are provided, but, for example, even if the slave chip 101 can be used for only 64 bit width by setting of operating modes, the control circuit 201 is provided with the data terminal pads 303 for 256 bits.

The operating mode-regulating pads (operating specification-regulating terminals) 304 includes, for example, the pads that regulate the latency of data output from the slave chip 101, or for example, may include the pads for selecting the bus width of the data terminal from 8 bits, 16 bits, . . . , 128 bits, or 256 bits. If these operating mode-regulating pads 304 have a pull-down function or a pull-up function, they can be made a default setting when connections are not made whereas they can be made a setting other than a default setting when connections are made. Of course, it is possible that the pads do not have a pull-down function or a pull-up function and connections are presupposed.

In addition, the internal voltage-regulating pads (generated voltage-regulating terminals) 305 are for regulating and setting a voltage generated by a voltage generator (not shown in the figure) disposed in the control circuit 201 of the slave chip 101. When these regulating pads are the terminals having a pull-down function or a pull-up function, they are made a default setting when connections are not made whereas they are made a setting other than a default setting when connections are made. Of course, and it is possible that the terminals do not have a pull-down function or a pull-up function and connections are presupposed. The internal voltage-regulating pads 305 are configured to be, for example, the pads for controlling the precharge voltage of a bit line-precharge voltage, or to be the pads for controlling an activation voltage for word lines.

Thus, the control circuit 201 having the same configuration is used even when the memory cell array 204 of the slave chip 101 has varied specifications such as the capacity and the data bus width, and varied grades.

Consequently, according to the present embodiment, the configuration of the interchip connection pad 106 on the control circuit 201 is invariably specified regardless of the capacity of the memory cell array 204, and therefore, the same control circuit 201 can be used even if different slave chips 101 have different specifications such as capacities and bus widths and different grades. As a result, it is possible to reduce the man hours for development of the slave chip 101.

In addition, by providing the operating mode-regulating pads 304, the operating mode of the slave chip 101 can be selected by a setting from the master chip 102, and this increases versatility of the slave chip 101. Moreover, the provision of the internal voltage-regulating pads 305 makes it possible to select the setting of the internal voltage by a setting from the master chip 102. Therefore, versatility of the slave chip 101 increases, and it is possible to reduce man hours for performing the setting by means of laser trimming or the like as conventionally carried out.

Figure 4:
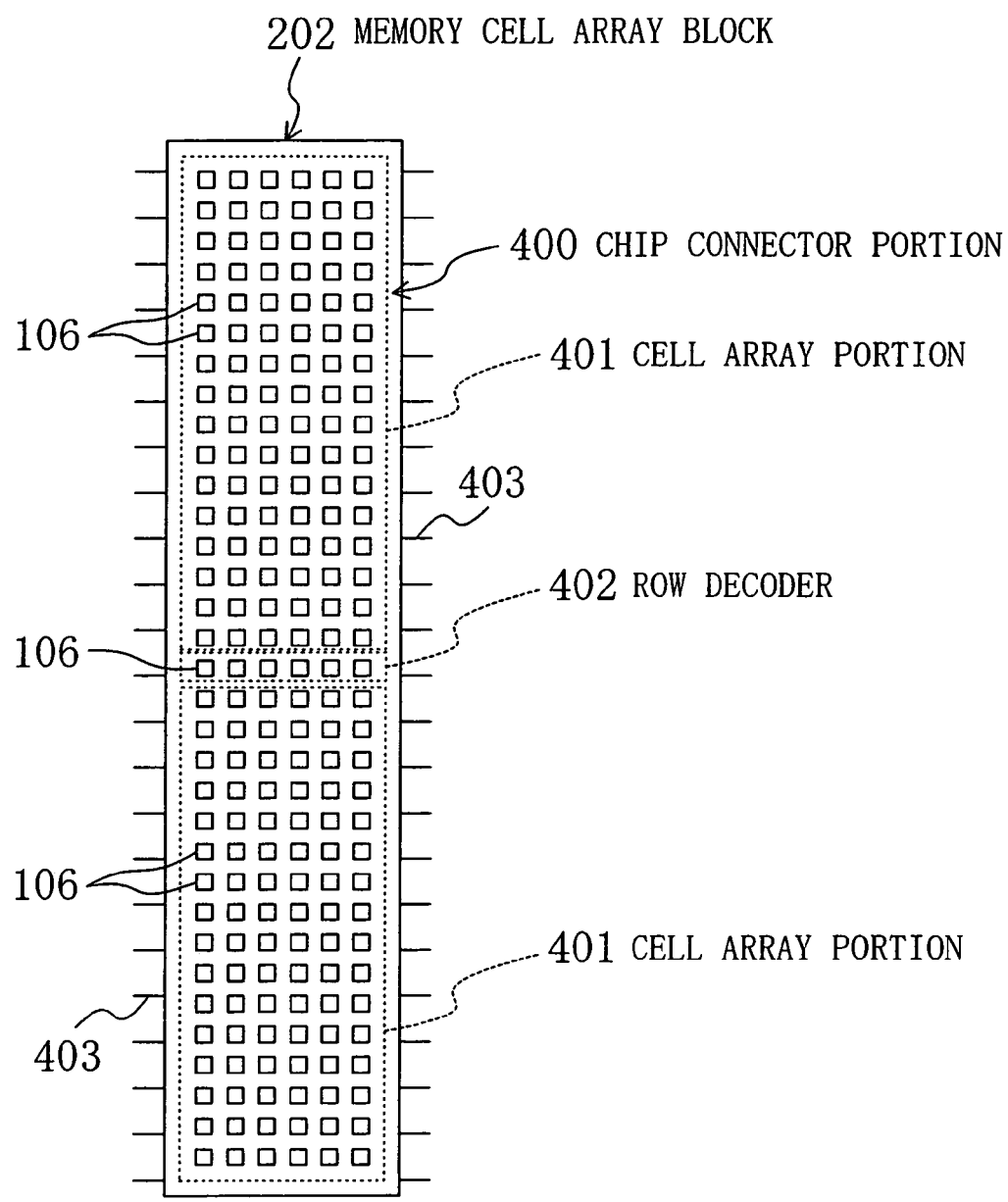
FIG. 4 is a diagram showing an example of arrangement of a plurality of pads provided in the chip connector portion of a memory cell array block that is incorporated in the slave chip.

FIG. 4 shows an arrangement of the interchip connection pads 106 in the chip connector portion 400 that is disposed in an upper layer of the memory cell array block 202. As shown in the figure, the interchip connection pads (terminal) 106 that are spaced at regular intervals are provided in a row decoder 402 and two cell array portions 401 that are located above and below the row decoder in the figure. Reference numeral 403 denotes array-connecting terminals extending laterally, which are for connection with other memory cell array blocks 202 located on the right and left in the figure.

Although not shown in the drawing, each of the cell array portions 401 is composed of a multiplicity of memory cells arranged in a matrix and sense amplifiers that are connected thereto. Global bit lines connected to these sense amplifiers are connected to array connecting terminals 403. The row decoder 402 includes a word driver and an address decoder for activating a plurality of memory cells.

In the chip connector portion 400, the plurality of interchip connection pads 106 on each of the cell array portions 401 are generally the terminals for connecting power supply and ground, and they are disposed at predetermined locations so as to reduce the impedance. Likewise, the interchip connection pads 106 on the row decoder 402 are used for terminals for connecting power supply and ground, or block controlling terminals, or other terminals. Details of the block controlling terminals are described later.

Thus, the memory cell array block 202 has the chip connector portion 400 provided with terminals that are necessary to operate the memory cell array block 202, such as power supply terminals and block controlling terminals, and the chip connector portion 400 is constructed to have the same configuration between the memory cell array blocks 202, which are formed into a module.

Thus, the memory cell array block 202 is formed into a module including the chip connector portion 400 having the pads for connecting power supply and ground. For this reason, even when the capacity of the memory cell array 204 is changed, it is only necessary to increase or decrease the number of the memory cell array blocks 202, and it is unnecessary to change the layout of the memory cell array block 202 itself. Therefore, it is possible to reduce the man hours for development of the memory cell array block 202. Furthermore, even if the installed capacity of the slave chip 101 is changed, power can be stably supplied to each of the memory cell array blocks 202.

First Modified Example of Memory Cell Array Block

Figure 5:
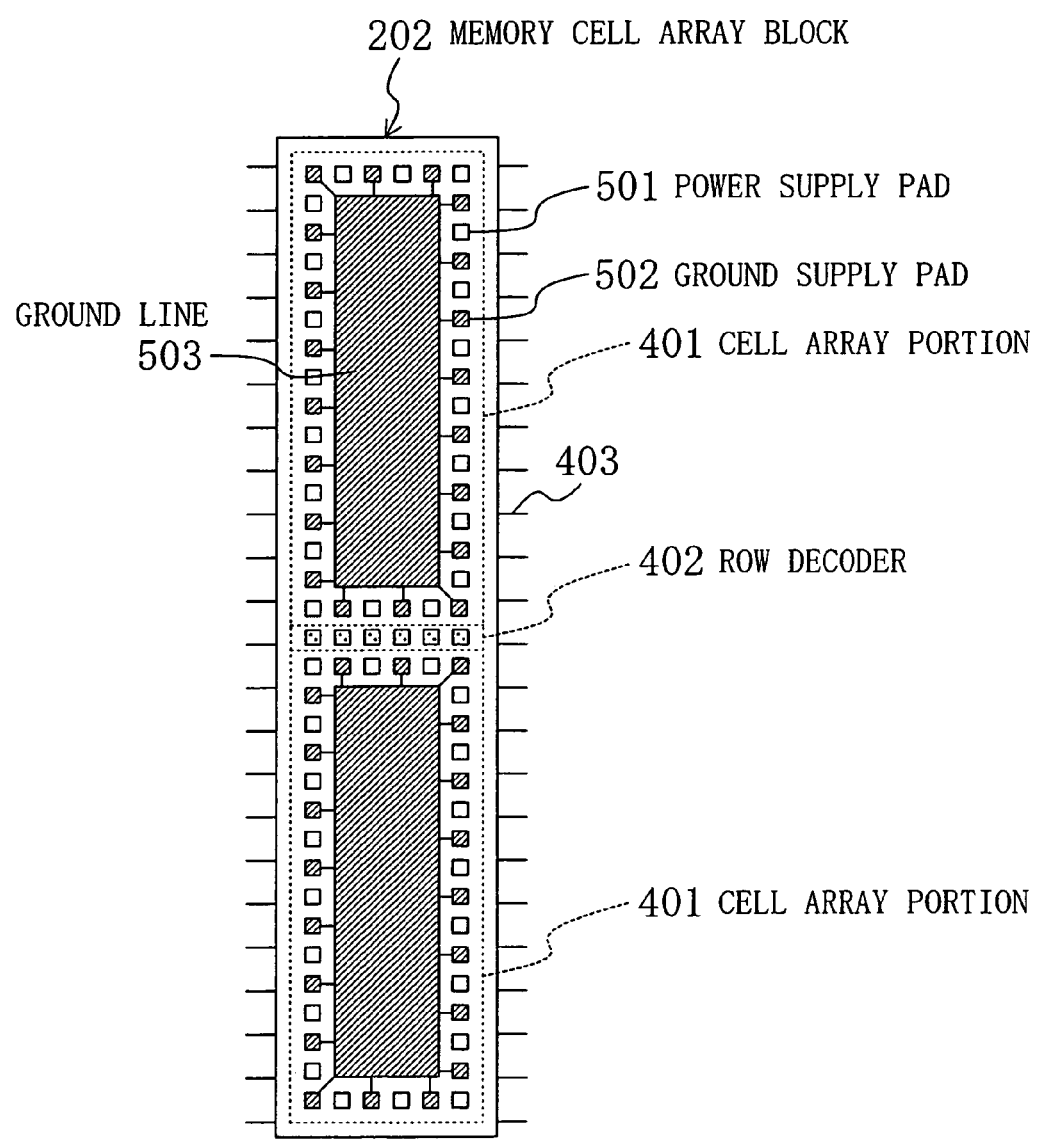
FIG. 5 a diagram showing a first modified example of the chip connector portion of a memory cell array block that is incorporated in the slave chip.

FIG. 5 shows a first modified example of the arrangement of the interchip connection pads 106 on the memory cell array block 202. In the figure, reference numeral 501 denotes a power supplying pad, numeral 502 denotes a ground supplying pad, and numeral 503 denotes a ground line. The ground line 503 is fabricated using the same wiring layer in which the interchip connection pads 106 are formed. The ground line 503 is formed in a wide area that substantially covers most of the memory cells in the memory cell array block 202.

Accordingly, in the present modified example, it is possible to effectively suppress adverse effects of the noise generated by the master chip 102 over the entire memory cell array 202 because of the arrangement of respective pads 501 and 502 for connecting power supply and ground shown in FIG. 5.

First Modified Example of Row Decoder

Figure 6:
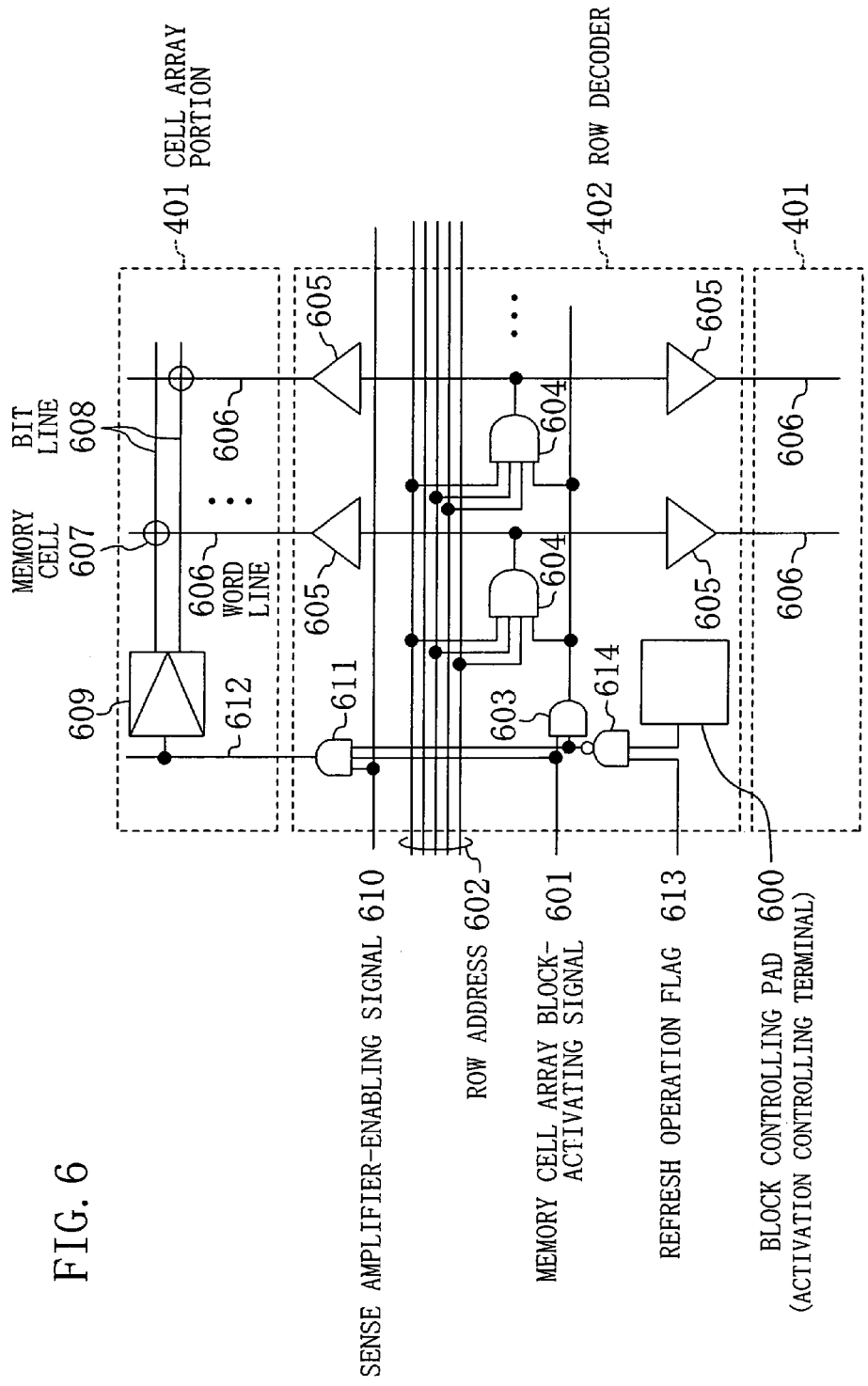
FIG. 6 is a diagram showing a first modified example of a row decoder that is arranged in the memory cell array block.

FIG. 6 shows a first modified example of the row decoder 402, which is disposed on the memory cell array block 202 composed of, for example, a DRAM.

In the figure, reference numeral 600 denotes a block controlling pad (activation control terminal), which is one of the plurality of interchip connection pads 106 formed in the chip connector portion 400 and is a terminal for collectively controlling activation and inactivation of all the memory cells in each cell array portion 401 of the memory cell array block 202 during a refresh operation in which data are rewritten into the memory cells. Reference numeral 601 denotes a memory cell array block-activating signal, numeral 602 denotes a row address, numeral 603 denotes a first AND element, numeral 604 denotes a second group of AND elements, numeral 605 denotes a word driver, numeral 606 denotes a word line, numeral 607 denotes a memory cell, numeral 608 denotes a bit line, numeral 609 denotes a sense amplifier, numeral 610 denotes a sense amplifier-enabling signal, numeral 611 denotes a third AND element, numeral 612 denotes an intra-block sense amplifier-enabling signal, numeral 613 denotes a refresh operation flag, and numeral 614 denotes a first NAND element.

The block controlling pad 600 and the refresh operation flag 613 are electrically connected to the input of the first NAND element 614. The output from the first NAND element 614 and the memory cell array block-activating signal 601 are input to the first AND element 603. The output from the first AND element 603 and a predetermined row address 602 are input into the second group of AND elements 604. A plurality of the word drivers 605 are connected to the outputs from the second group of AND elements 604, and the word drivers 605 are provided with the word lines 606. A plurality of the memory cells 607 are disposed at a plurality of intersectional points of the word lines 606 and the bit lines 608, and a plurality of the bit lines 608 are connected to a plurality of the sense amplifiers 609. The input of the third AND element 611 is electrically connected to the sense amplifier-enabling signal 610, the output from the first NAND element 614, and the memory cell array block-activating signal 601, and the output therefrom becomes the intra-block sense amplifier-enabling signal 612. The intra-block sense amplifier-enabling signal 612 is input into a plurality of the sense amplifiers 609. The foregoing memory cell array block-activating signal 601 is supplied from the control circuit 201, and the potential thereof is determined by predetermined most significant bits among the address terminal pads 301. The potential of the foregoing row address 602 is determined by predetermined least significant bits among a plurality of the address terminal pads 301.

The operation of the present modified example thus configured is described below with reference to FIG. 7.

Figure 7:
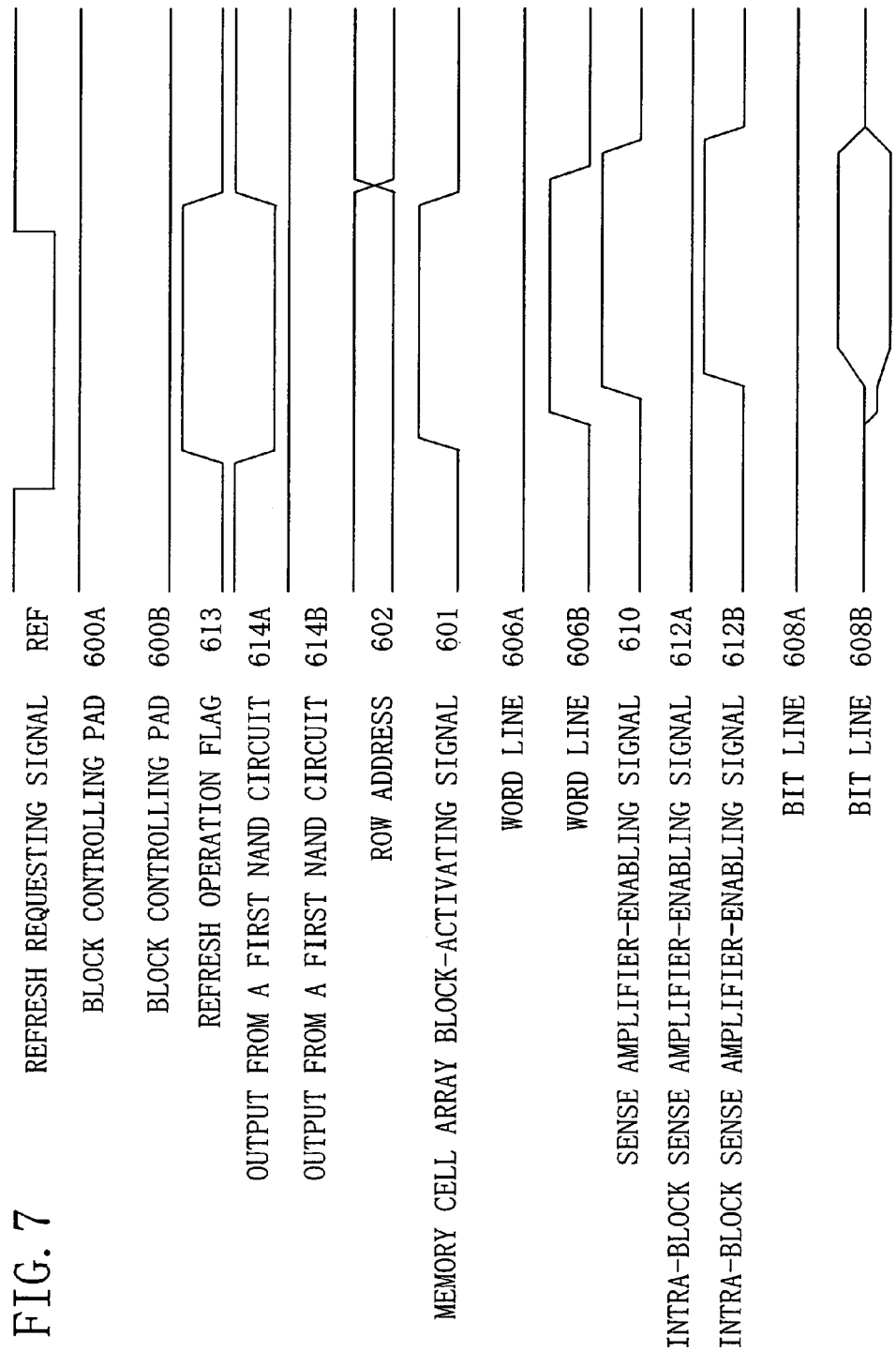
FIG. 7 is a timing chart showing the operation of the row decoder.

In FIG. 7, REF denotes a refresh-requesting signal that is input into the control circuit 201. Here, the memory cell array blocks 202 for which a refresh operation is to be stopped are referred to as memory cell array blocks A, whereas the memory cell array blocks 202 for which the refresh operation is to be performed are referred to as a memory cell array block B. Reference numerals 600A and 600B respectively denote the signal levels of the block controlling pads of the memory cell array blocks A and B, which are set at a high level and a low level, respectively. Reference numerals 606A, 606B, 612A, 612B, 608A, and 608B also denote signal levels likewise.

As seen from FIG. 7, if the refresh-requesting signal REF is brought to a low level, then the refresh operation flag 613 is brought to a high level in the control circuit 201. In response to this, an output 614A of the first NAND element 614, which belongs to the memory cell array block A, is brought to a low level.

An output 614B of the first NAND element 614 that belongs to the memory cell array block B is brought to a high level. When a predetermined memory cell array block-activating signal 601 is brought to a high-level by the control circuit 201, a word line 606A, which belongs to the memory cell array block A, is maintained at a low level while a word line 606B, which belongs to the memory cell array block B and is determined by a row address 602, is brought to a high level. When a sense amplifier-enabling signal 610 is brought to a high level by the control circuit 201, an intra-block sense amplifier-enabling signal 612A, which belongs to the memory cell array block A, is maintained at a low level while an intra-block sense amplifier-enabling signal 612B, which belongs to the memory cell array block B is brought to a high level. Because the intra-block sense amplifier-enabling signal 612A is maintained at a low level, a bit line 608A, which belongs to the memory cell array block A, is not activated. When the intra-block sense amplifier-enabling signal 612B becomes a high level, a bit line 608B, which belongs to the memory cell array block B, is activated, consuming electric current.

Thus, by providing the block controlling pad 600 serving as the interchip connection pad 106, it is made possible to control whether a refresh operation is to be performed or not for each of the memory cell array blocks 202, and power consumption during a refresh operation can be reduced.

It should be noted that, in the present modified example thus configured, the configuration may be such that the refresh operation flag 613 may become high level only during a so-called auto-refresh operation in which the control is performed by a low or a high potential of an external clock and a control terminal, or such that the refresh operation flag 613 becomes a high level only during a so-called self-refresh operation in which the control is performed by an internal clock generated inside of the control circuit 201. Of course, the configuration in which the refresh operation flag 613 becomes a high level during both an auto-refresh operation and self-refresh operation is also possible. In a standby mode, for example, the logic circuit on the master chip that control the semiconductor memory device can prohibit a refresh operation for each of the memory cell array blocks 202 during a self-refresh operation, and therefore, power consumption can be finely controlled. In addition, the configuration of the block controlling pad 600 may be such that it has a pull-down function so that its activation is possible even when an electrical connection is not made to the block controlling pad 600.

Second Modified Example of Row Decoder

Figure 8:
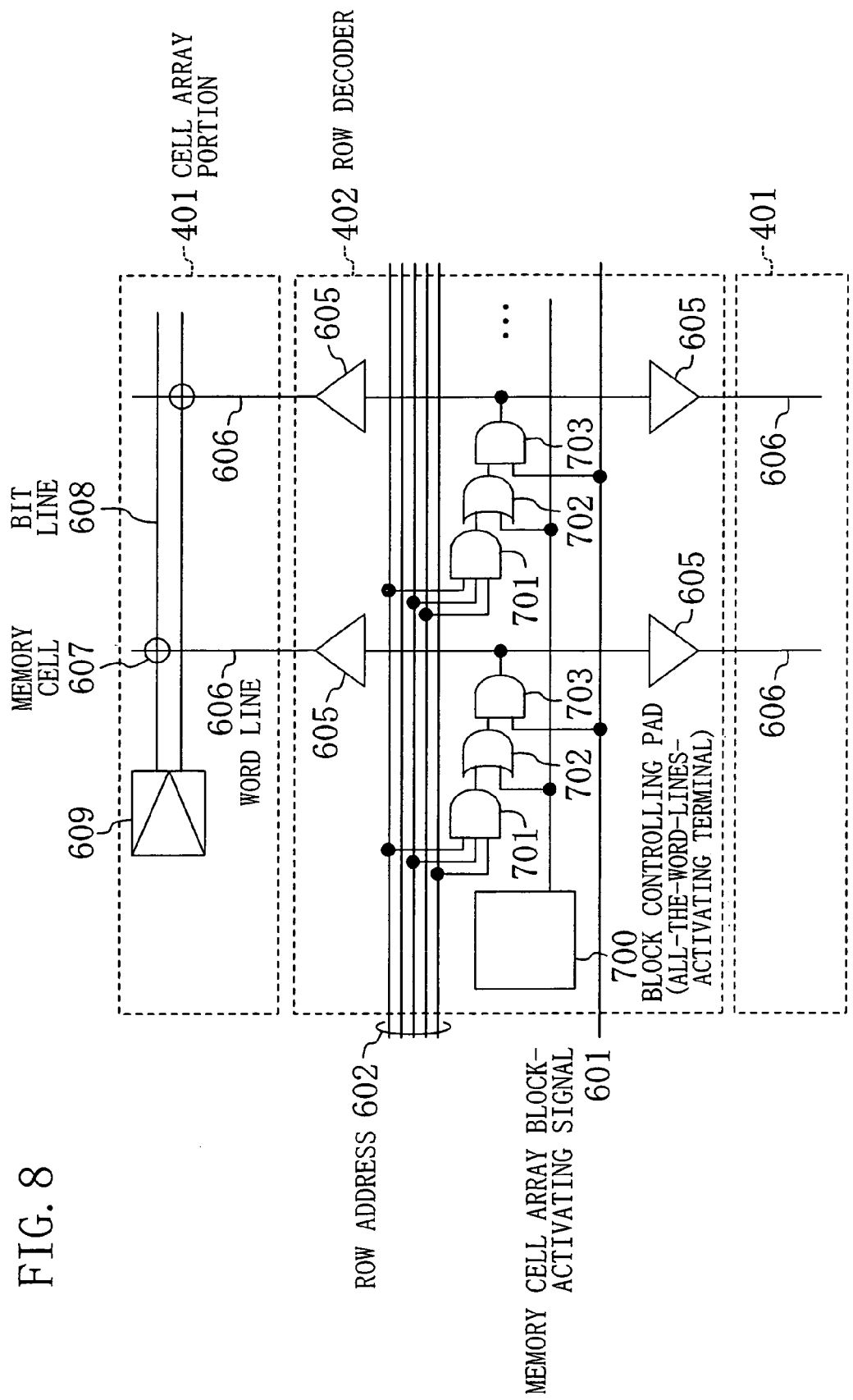
FIG. 8 is a diagram showing a second modified example of the row decoder that is arranged in the memory cell array block.

FIG. 8 shows a second modified example of the row decoder 402 disposed on the memory cell array block 202.

In the figure, reference numeral 700 denotes a block controlling pad (all-the-word-lines-activating terminal), which is a terminal for activating all the word lines provided in the memory cell array block 202 in which the block controlling pad itself is provided, among a plurality of interchip connection pads 106 formed in the chip connector portion 400. Reference numeral 701 denotes a fourth group of AND elements, numeral 702 denotes a first group of OR elements, and numeral 703 denotes a fifth group of AND elements.

A predetermined row address 602 is input to the fourth group of AND elements 701. The outputs from the fourth group of AND elements 701 and the block controlling pad 700 are electrically connected to the inputs of the first group of the OR elements 702. The outputs from the first group of the OR elements 702 and the memory cell array block-activating signal. 601 are input to the fifth group of the AND elements 703. A plurality of word drivers 605 are connected to the outputs of the fifth group of the AND elements 703, and to the word drivers 605, word lines 606 are connected from the cell array portions 401 that are located above and below the row decoder 402. A memory cell 607 is disposed at each intersectional point of the word lines 606 and the bit lines 608, and the bit lines 608 are connected to the sense amplifier 609.

The memory cell array block-activating signal 601 is supplied from the control circuit 201, and the potential thereof is determined by the pads for predetermined most significant bits among the address terminal pads 301. The row address 602 is determined by the pads for predetermined least significant bits among the address terminal pads 301.

Figure 9:
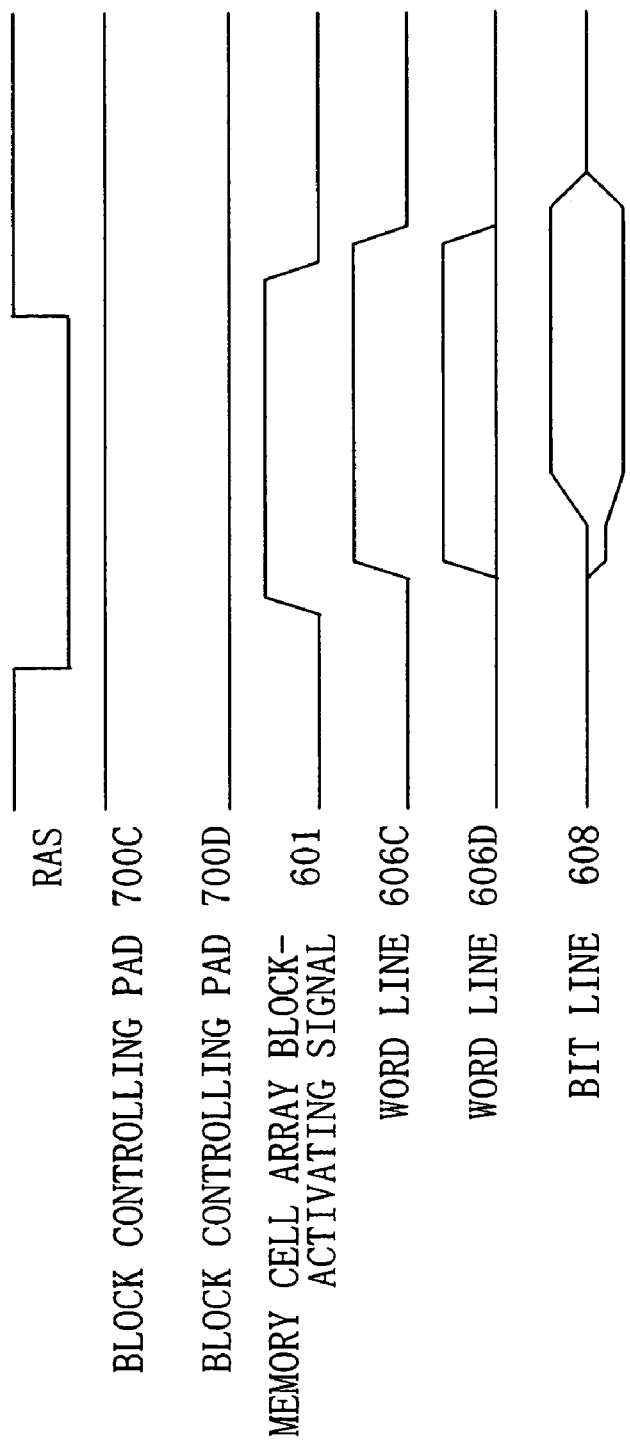
FIG. 9 is a timing chart showing the operation of the row decoder.

The operation of the present modified example thus configured is described below with reference to FIG. 9.

Hereafter, the memory cell array block 202 in which all the word lines 606 are to be brought to a high-level is referred to as a memory cell array block C, the memory cell array block 202 in which only one of the word lines 606 is to be brought to a high-level is referred to as a memory cell array block D. In FIG. 9, RAS denotes a row address strobe signal that is applied to the control circuit 201. Reference numeral 700C denotes a block controlling pad that belongs to the memory cell array block C, numeral 700D denotes a block controlling pad that belongs to the memory cell array block D, numeral 606C denotes a plurality of word lines that belongs to the memory cell array block C, and numeral 606D denotes a plurality of word lines that belongs to the memory cell array block D.

In the memory cell array block C, the block controlling pad 700C, which belongs thereto, is brought to a high level (first electrical state). On the other hand, in the memory cell array block D, the block controlling pad 700D, which belongs thereto, is brought to a low level.

When the row address strobe signal RAS is brought to a low level, a predetermined memory cell array block-activating signal 601 is brought to a high level in the control circuit 201. When the memory cell array block-activating signal 601 is brought to a high level, all the word lines that belong to the memory cell array block C are activated at the same time. Regarding a plurality of word lines that belong to the memory cell array block D, only a predetermined word line that is determined by the row addresses 602 is activated.

Thus, in the present modified example, by controlling the potential of the block controlling pad 700, it is made possible to select whether only one word line is activated or all the word lines are activated at the same time. As a result, with one access, data can be written to all the memory cells 607 that are disposed in the memory cell array block 202, and thus, data erasure and data writing time to all the memory cells can be reduced. In addition, when a reliability test is performed for memory cells, it is possible to apply stress to all the memory cells at the same time.

It should be noted that the block controlling pad 700 may have a configuration such that it has a pull-down function so that activation for one word line is possible even when an electrical connection is not made to the block controlling pad 700. In addition, although the potential of the block controlling pad 700 is brought to a high level so that all the word lines can be activated in the present modified example, it is also possible to employ a configuration in which most of the word lines except the word lines for redundancy repair are activated. Of course, the word lines for redundancy repair may be activated at the same time.

Third Modified Example of Row Decoder

Figure 10:
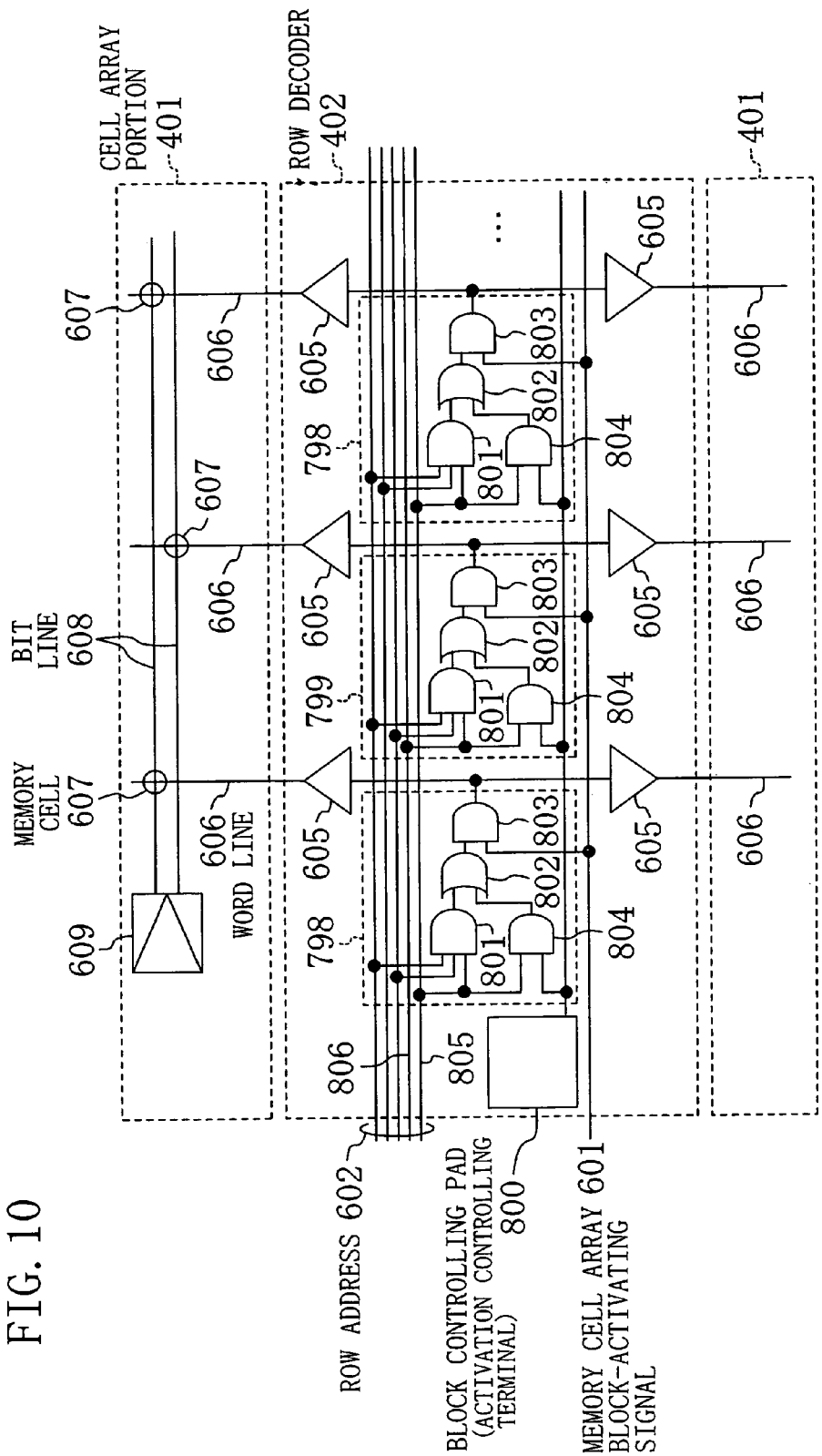
FIG. 10 is a diagram showing a third modified example of the row decoder that is arranged in the memory cell array block.

FIG. 10 shows a third modified example of the row decoder 402 disposed on the memory cell array block 202.

In the figure, reference numeral 800 denotes, of the interchip connection pads 106, a block controlling pad (half-of-the-word-lines-activating terminal), which is a terminal for activating half of the word lines provided in the memory cell array block 202 in which the block controlling pad itself is provided according to the least significant bit (address signal) of the row address. Reference numeral 798 denotes an address decoder for even-numbered word lines, numeral 799 denotes an address decoder for odd-numbered word lines, numeral 801 denotes a sixth group of AND elements, numeral 802 denotes a second group of OR elements, numeral 803 denotes a sixth group of AND elements, numeral 804 denotes a seventh group of AND elements, numeral 805 denotes the least significant bit of the row address 602, and numeral 806 denotes a negative phase signal for the least significant bit of the row address 602.

In the row decoder 402, a plurality of address decoders 798 for even-numbered word lines and a plurality of address decoders 799 for odd-numbered word lines are provided. In the address decoder 798 for even-numbered word lines, a predetermined row address 602 is input to the sixth group of AND elements 801, and the least significant bit 805 of the row address 602 and the block controlling pad 800 are connected and input to the inputs of the seventh group of AND elements 804. The outputs of the sixth group of the AND elements 801 and the outputs of the seventh group of AND elements 804 are input into the second group of OR elements 802. The outputs of the second group of OR elements 802 and a predetermined memory cell array block-activating signal 601 are input into the inputs of the sixth group of AND elements 803. The outputs of the sixth group of AND elements 803 are input into predetermined word drivers 605. The outputs of the sixth group of AND elements 803 become the outputs from the address decoders 798 even-numbered word lines. The address decoders 798 for even-numbered word lines are thus configured. The outputs from the address decoders 798 for even-numbered word lines are output to the even-number-th word drivers 605.

On the other hand, the configuration of address decoders 799 for odd-numbered word lines differ from the address decoders 798 for even-numbered word lines in that the negative phase least significant bit 806 of the row address 602 is input in place of the least significant bit 805 of the row address 602. The outputs from the address decoders 799 for odd-numbered word lines are output to the odd-number-th word drivers 605. The memory cells 607 are disposed at intersectional points of all the even-numbered word lines 606 and predetermined half of the bit lines 608. Also, the memory cells 607 are disposed at intersectional points of all the odd-numbered word lines 606 and predetermined half of the bit lines 608 to which the memory cells 607 are not disposed for the even-numbered word lines.

Figure 11:
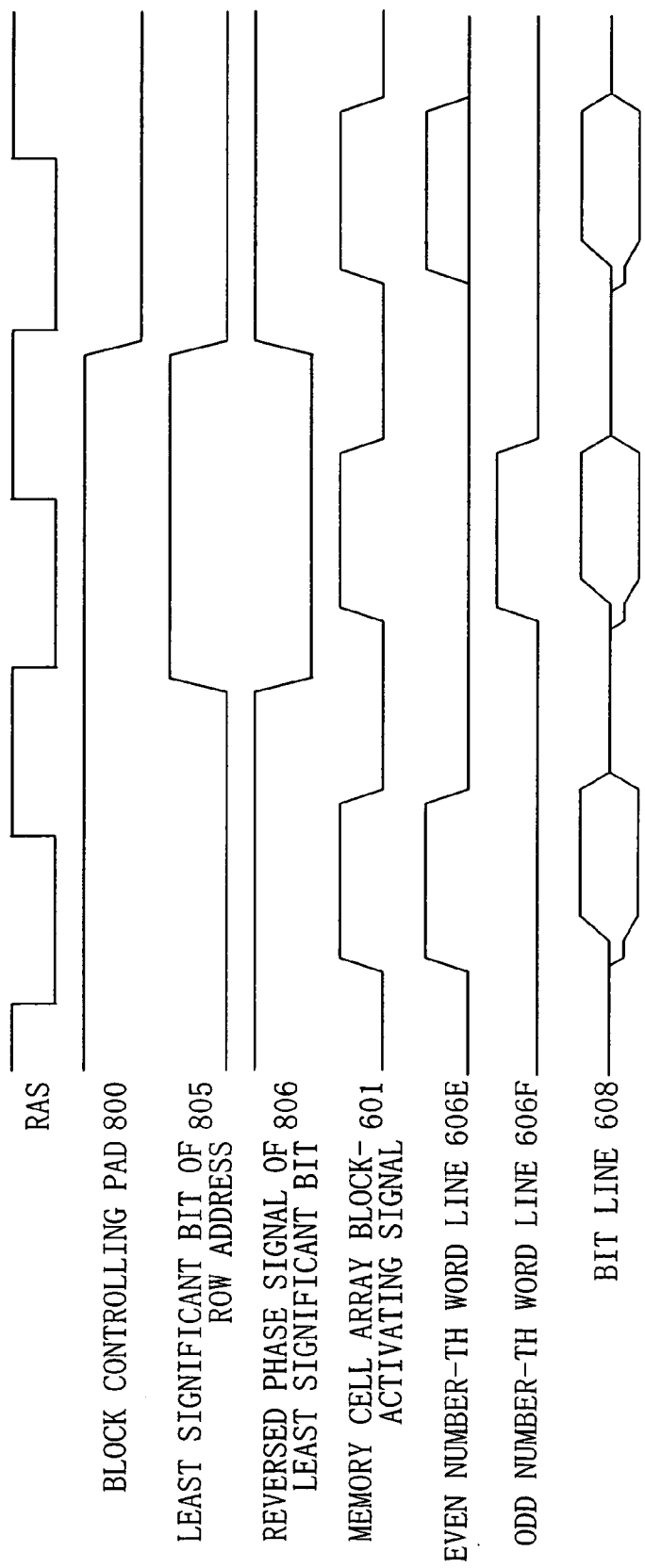
FIG. 11 is a timing chart showing the operation of the row decoder.

Next, the operation of the present modified example is described with reference to FIG. 11. In the figure, reference numeral 606E denotes a plurality of word lines 606 that are connected to a plurality of address decoders 798 for even-numbered word lines, and numeral 606F denotes a plurality of word line 606 that are connected to a plurality of address decoders 799 for odd-numbered word lines.

In the case where the block controlling pad 800 is at a high level (first electrical state) and the least significant bit 805 of the row address 602 is at a high level, all the plurality of even-numbered word lines 606E connected to the address decoders 798 for even-numbered word lines are activated at the time when the outputs of the plurality of second OR elements 802 disposed in the address decoders 798 for even-numbered word lines become a high level and a predetermined memory cell array block-activating signal 601 becomes a high level. On the other hand, in the case where the block controlling pad 800 is at a high level and the least significant bit 805 of the row address 602 is at a low level, all the plurality of odd-numbered word lines 606F connected to the address decoders 799 for odd-numbered word lines are activated at the time when the negative phase least significant bit 806 of the row address 602 becomes a high level, the outputs from the plurality of second OR elements 802 that are disposed in the address decoders 799 for odd-numbered word lines become a high level, and a predetermined memory cell array block-activating signal 601 becomes a high level.

In contrast, in the case where the block controlling pad 800 is at a low level, only one of the outputs from the second group of OR elements 802 that is determined by the row address 602 becomes a high level in a memory cell array block 202, only one predetermined word line 606 is activated at the time when a predetermined memory cell array block-activating signal 601 becomes a high level.

Thus, in the present modified example, by controlling the potential of the block controlling pad 800, it is made possible to select whether only one word line is activated or half of the word lines are activated at the same time according to the least significant bit of the row address 602. As a result, to all the memory cells 607 disposed in the memory cell array block 202, the same data (data having the same topology) can be written with two accesses, and therefore, data erasure and data writing time to all the memory cells in the memory cell array block 202 can be reduced. In addition, when a reliability test is performed for memory cells, it is possible to apply stress according to data topology to all the memory cells at the same time.

It should be noted that the block controlling pad 800 may have a configuration such that it has a pull-down function so that activation for one word line is possible even when an electrical connection is not made to the block controlling pad 800. In addition, although the potential of the block controlling pad 800 is brought to a high level so that half of the word lines can be activated in the present modified example, it is also possible to employ a configuration in which almost half of the word lines except the word lines for redundancy repair are activated. Of course, the word lines for redundancy repair may be activated at the same time.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A semiconductor memory device formed of a semiconductor chip for being overlaid onto a surface of another semiconductor chip to be electrically connected therewith, comprising:
    a memory cell array including a plurality of memory cell array blocks each having a plurality of memory cells, each of the memory cell array blocks having a predetermined basic capacity;
    a control circuit, which is formed on the same semiconductor chip as the memory cell array is formed, for controlling reading and writing from and into the memory cells in the memory cell array;
    a common chip connector portion having terminals formed on the control circuit for connecting to another semiconductor chip; and
    a plurality of individually provided chip connector portions, each individually provided for each of the memory cell array blocks, each having terminals formed on each of the memory cell array blocks, all of the plurality of individually provided chip connector portions having a same configuration.

2. The semiconductor memory device according to claim 1, wherein each of the individually provided chip connector portions includes an activation controlling terminal that controls, when a refresh operation for restoring memory cell data is performed for memory cells in a corresponding memory cell array block, whether the memory cells in the corresponding memory cell array block are activated or are not activated.

3. The semiconductor memory device according to claim 2, wherein the refresh operation is an auto-refresh operation controlled by an external clock and a control terminal.

4. The semiconductor memory device according to claim 2, wherein the refresh operation is a self-refresh operation controlled by an internal clock generated internally.

5. The semiconductor memory device according to claim 1, wherein:
    each of the memory cell array blocks comprises a plurality of memory cells and a plurality of word lines connected to the plurality of memory cells; and
    each of the individually-provided chip connector portions comprises an all-of the-word-lines-activating terminal for activating all the plurality of word lines in a corresponding memory cell array block when in a first electrical state.

6. The semiconductor memory device according to claim 1, wherein:
    each of the memory cell array blocks comprises a plurality of memory cells and a plurality of word lines connected to the plurality of memory cells; and
    each of the individually-provided chip connector portions comprises a half-of-the-word-lines-activating terminal for selectively activating about half of the plurality of word lines in a corresponding memory cell array block when in a first electrical state.

7. The semiconductor memory device according to claim 1, wherein a ground wire is disposed in each of the individually provided chip connector portions in the same wiring layer in which the terminals of the individually provided chip connector portions are formed, the ground wire covering most of the memory cells in the corresponding memory cell array block.

8. A multi-chip module comprising:
    a slave chip that is the semiconductor memory device according to claim 5; and
    a master chip having a chip connector portion in which terminals to be connected to the slave chip are formed;
    wherein the terminals of the chip connector portion of the slave chip are overlaid onto the terminals of the chip connector portion of the master chip to electrically connect the terminals of the respective chips together.

* * * * *